United States Patent
Rim et al.

(10) Patent No.: US 9,559,236 B2
(45) Date of Patent: Jan. 31, 2017

(54) SOLAR CELL FABRICATED BY SIMPLIFIED DEPOSITION PROCESS

(71) Applicant: SunPower Corporation, San Jose, CA (US)

(72) Inventors: Seung Bum Rim, Palo Alto, CA (US); Matthieu Moors, Braine-le-Chateau (BE)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/495,565

(22) Filed: Sep. 24, 2014

(65) Prior Publication Data
US 2016/0087140 A1    Mar. 24, 2016

(51) Int. Cl.
| | |
|---|---|
| *H01L 31/00* | (2006.01) |
| *H01L 31/068* | (2012.01) |
| *H01L 31/18* | (2006.01) |
| *C30B 25/02* | (2006.01) |
| *H01L 31/0288* | (2006.01) |

(Continued)

(52) U.S. Cl.
CPC .......... *H01L 31/0682* (2013.01); *C30B 25/02* (2013.01); *C30B 29/06* (2013.01); *H01L 31/0288* (2013.01); *H01L 31/02363* (2013.01); *H01L 31/022441* (2013.01); *H01L 31/022458* (2013.01); *H01L 31/03682* (2013.01); *H01L 31/182* (2013.01); *H01L 31/1804* (2013.01); *H01L 31/1892* (2013.01); *H01L 31/028* (2013.01); *Y02E 10/50* (2013.01); *Y02E 10/547* (2013.01)

(58) Field of Classification Search
CPC .................. H01L 31/0682; H01L 31/022441; H01L 31/02245; H01L 31/022458; H01L 31/028; Y02E 10/50; Y02E 10/547

USPC ................ 136/244, 252, 255, 256, 258, 261
See application file for complete search history.

(56) References Cited

U.S. PATENT DOCUMENTS 5,053,083 A * 10/1991 Sinton ............... H01L 31/03529
136/255
6,749,687 B1    6/2004 Ferro et al.
(Continued)

OTHER PUBLICATIONS

Smith, David., "Solar Cell With Trench-Free Emitter Regions", U.S. Appl. No. 14/227,965, filed Mar. 27, 2014, 30 pgs.

(Continued)

*Primary Examiner* — Lindsey Bernier
(74) *Attorney, Agent, or Firm* — Blakely Sokoloff Taylor Zafman LLP (57) ABSTRACT

Methods of fabricating solar cells using simplified deposition processes, and the resulting solar cells, are described. In an example, a method of fabricating a solar cell involves loading a template substrate into a deposition chamber and, without removing the template substrate from the deposition chamber, performing a deposition method. The deposition method involves forming a first silicon layer on the template substrate, the first silicon layer of a first conductivity type. The deposition method also involves forming a second silicon layer on the first silicon layer, the second silicon layer of the first conductivity type. The deposition method also involves forming a third silicon layer above the second silicon layer, the third silicon layer of a second conductivity type. The deposition method also involves forming a solid state doping layer on the third silicon layer, the solid state doping layer of the first conductivity type.

5 Claims, 5 Drawing Sheets

(51) Int. Cl.
  H01L 31/0368 (2006.01)
  H01L 31/0224 (2006.01)
  H01L 31/0236 (2006.01)
  C30B 29/06 (2006.01)
  H01L 31/028 (2006.01)

(56) References Cited

U.S. PATENT DOCUMENTS

| | | | |
|---|---|---|---|
| 7,705,237 B2* | 4/2010 | Swanson | H01L 31/035281 |
| | | | 136/243 |
| 8,486,746 B2 | 7/2013 | Rim et al. | |
| 2004/0200520 A1* | 10/2004 | Mulligan | H01L 31/022441 |
| | | | 136/256 |
| 2009/0227063 A1 | 9/2009 | Ravi et al. | |
| 2011/0174376 A1 | 7/2011 | Lochtefeld et al. | |
| 2012/0060904 A1* | 3/2012 | Smith | H01L 31/035218 |
| | | | 136/252 |
| 2012/0138135 A1 | 6/2012 | Manning | |
| 2014/0065764 A1 | 3/2014 | Scardera et al. | |
| 2014/0162399 A1 | 6/2014 | Cudzinovic et al. | |
| 2015/0280043 A1* | 10/2015 | Smith | H01L 31/068 |
| | | | 136/256 |

OTHER PUBLICATIONS

International Search Report and Written Opinion from PCT/US2015/051561 mailed Feb. 23, 2016, 12 pgs.

* cited by examiner

FIG. 11

SOLAR CELL FABRICATED BY SIMPLIFIED DEPOSITION PROCESS

TECHNICAL FIELD

Embodiments of the present disclosure are in the field of renewable energy and, in particular, methods of fabricating solar cells using simplified deposition processes, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1-6 illustrate cross-sectional views of various stages in the fabrication of a solar cell, in accordance with an embodiment of the present disclosure, wherein:

FIGS. 8-10 illustrate cross-sectional views of various stages in the fabrication of a solar cell, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cells using simplified deposition processes, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves loading a template substrate into a deposition chamber and, without removing the template substrate from the deposition chamber, performing a deposition method. The deposition method involves forming a first silicon layer on the template substrate, the first silicon layer of a first conductivity type. The deposition method also involves forming a second silicon layer on the first silicon layer, the second silicon layer of the first conductivity type. The deposition method also involves forming a third silicon layer above the second silicon layer, the third silicon layer of a second conductivity type. The deposition method also involves forming a solid state doping layer on the third silicon layer, the solid state doping layer of the first conductivity type.

In another embodiment, a method of fabricating a solar cell involves loading a porous silicon substrate into a deposition chamber at a chamber temperature approximately in the range of 400-800 degrees Celsius and, without removing the porous silicon substrate from the deposition chamber, performing a deposition method. The deposition method involves forming a first N-type monocrystalline silicon layer on the porous silicon substrate at a temperature approximately in the range of 1000-1300 degrees Celsius, the first N-type monocrystalline silicon layer having a phosphorous concentration approximately in the range of 1E18-1E20 atoms/$cm^3$ and having a thickness approximately in the range of 0.1-10 microns. The deposition method also involves forming a second N-type monocrystalline silicon layer on the first N-type monocrystalline silicon layer at a temperature approximately in the range of 1000-1300 degrees Celsius, the second N-type monocrystalline silicon layer having a phosphorous concentration approximately in the range of 1E14-1E17 atoms/$cm^3$ and having a thickness approximately in the range of 10-100 microns. The deposition method also involves forming a thin oxide layer on the second N-type monocrystalline silicon layer. The deposition method also involves forming a P-type monocrystalline silicon layer on the thin oxide layer at a temperature approximately in the range of 1000-1300 degrees Celsius, the P-type monocrystalline silicon layer having a boron concentration approximately in the range of 1E18-1E20 atoms/$cm^3$ and having a thickness approximately in the range of 0.1-1 micron. The deposition method also involves forming a phosphosilicate glass (PSG) layer on the P-type monocrystalline silicon layer at a temperature approximately in the range of 400-800 degrees Celsius. The deposition method also involves, subsequent to forming the PSG layer, removing the porous silicon substrate from the deposition chamber and subsequently performing a method involving driving phosphorous dopants from the PSG layer into regions of the P-type monocrystalline silicon layer. The method subsequently performed also involves removing, as a single material stack for a solar cell, the first N-type monocrystalline silicon layer, the second N-type monocrystalline silicon layer, and the P-type monocrystalline silicon layer from the porous silicon substrate. The method subsequently performed also involves forming a metallization structure above the P-type monocrystalline silicon layer.

Also disclosed herein are solar cells. In one embodiment, a solar cell includes a substrate having a light-receiving surface and a back surface. A thin dielectric layer is disposed on the back surface of the substrate. A first monocrystalline silicon emitter region is disposed on a first portion of the thin dielectric layer and is doped with an impurity of a first conductivity type. A second monocrystalline silicon emitter region is disposed on a second portion of the thin dielectric layer proximate to the first monocrystalline silicon emitter region disposed on the first portion of the thin dielectric layer. The second monocrystalline silicon emitter region is doped with an impurity of a second, opposite, conductivity type. A P/N junction is between the first monocrystalline silicon emitter region and the second monocrystalline silicon emitter region.

Embodiments described herein are directed to the simplified fabrication of polycrystalline silicon (Poly-Si) or monocrystalline silicon emitters as processed by in-situ doping and laser doping process operations. In a particular example, embodiments are directed to a simplified process for implementing trenchless silicon emitters on thin epitaxial (epi) silicon (Si) layers. One or more embodiments may be implanted to save costs for thin epitaxial silicon approaches involving the implementation of crystalline silicon emitter regions on thin epitaxial silicon structures.

To provide context, although thin epitaxial silicon can save Si cost in order to obtain low cost cells, high efficiency is still required in order to include such cells in the high efficiency premium solar cell market. The implementation of crystalline silicon emitter regions for such solar cells can increase efficiency due to their superior passivation quality and favorable properties of associated electrical contacts. However, relatively long (in duration) process operations may require high cost for implementation in a fabrication process. Accordingly, embodiments described herein may involve the incorporation of in-situ doping in an epitaxial deposition chamber and subsequent laser doping technique to simplify process operations and provide an approach for implementing crystalline silicon emitter regions on epi Si.

In an exemplary embodiment, as described in greater detail below, a solar cell fabrication scheme involves formation of a solar cell layer on a porosified template. For example, five layers may be formed in a single pass in an epitaxial (epi) deposition chamber: (1) an in-situ doped (e.g., N-type) front surface layer, (2) a lightly doped (e.g., N-type) or intrinsic Si "bulk" layer, (3) a tunnel oxide layer (which may be formed thermal growth, deposition, or a combination thereof, (4) a lightly doped (e.g., P-type) poly-Si or monocrystalline Si layer, and (5) a phosphorous doped oxide layer, such as a phosphosilicate glass (PSG) layer. The template may then be removed from the epi chamber and laser doping may then be applied to counter-dope the lightly doped P-type emitter (poly or mono crystalline) layer in certain regions by driving phosphorous from the PSG to the emitter layer. In one such embodiment, the counter-doping is readily achieved since the P-type emitter layer is very lightly doped. As an end result, a trenchless architecture can be fabricated where the N-type regions are heavily doped with phosphorous. In such an architecture, in an embodiment, an emitter push effect or co-diffusion risk is very low since the tunnel oxide suppresses dopant diffusion beneath the layer. The above two operations effectively complete emitter fabrication. Subsequent metallization and front surface process can also be implemented to complete a solar cell fabrication process. Approaches described herein may be implemented to provide high efficiency, low cost, thin Si solar cells.

In an exemplary process flow, FIGS. 1-6 illustrate cross-sectional views of various stages in the fabrication of a solar cell, in accordance with an embodiment of the present disclosure. FIG. 7 is a flowchart 700 listing operations in a method of fabricating a solar cell, as corresponding to FIGS. 1-6, in accordance with an embodiment of the present disclosure.

Figure 1:
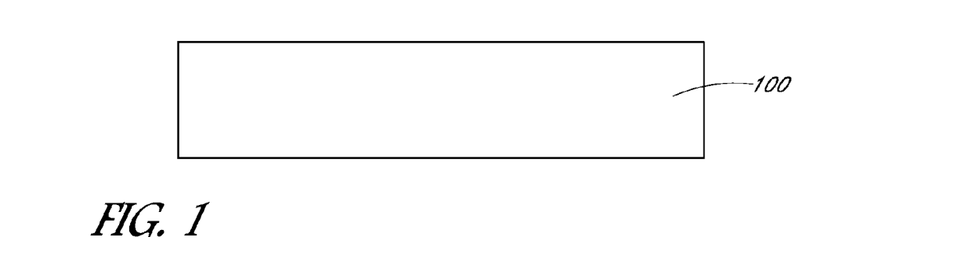
FIG. 1 illustrates a template substrate to be loaded into a deposition chamber.

Referring to operation 702 of flowchart 700 and to corresponding FIG. 1, a method of fabricating a solar cell involves loading a template substrate 100 into a deposition chamber. In an embodiment, without removing the template substrate 100 from the deposition chamber, the complete deposition method described below is performed. In other embodiment, at least a portion of the deposition method described below is performed without removing the template substrate 100 from the deposition chamber.

In an embodiment, the template substrate 100 is loaded into the deposition chamber at a chamber temperature approximately in the range of 400-800 degrees Celsius. In one such embodiment, the deposition chamber is an epitaxial deposition chamber, such as a chemical vapor deposition (CVD) reactor chamber with, e.g., an infra-red (IR) lamp used for heating within the chamber. In an embodiment the template substrate 100 is a porous silicon substrate (which, e.g., may have surfaces thereof sealed through an anneal process to leave only inner portions of the substrate porous). In one such embodiment, the top surface of the porous silicon layer is closed by preliminarily annealing at a temperature approximately in the range of 1000-1300 degrees Celsius in the chamber, prior to epitaxial deposition thereon. In an embodiment, without removing the porous silicon substrate from the deposition chamber, the following described layers are deposited as a single pass in the chamber.

Figure 2:
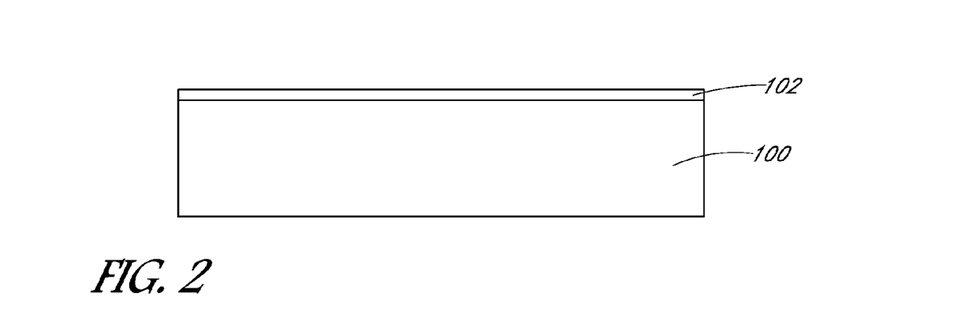
FIG. 2 illustrates the structure of FIG. 1 having first silicon layer formed thereon.

Referring now to operation 704 of flowchart 700 and to corresponding FIG. 2, the method of fabricating a solar cell involves forming a first silicon layer 102 on the template substrate 100. In an embodiment, the first silicon layer 102 is of a first conductivity type.

In an embodiment, the first silicon layer 102 is formed by depositing silicon at a temperature approximately in the range of 1000-1300 degrees Celsius. In one such embodiment, the first silicon layer 102 is formed as an N-type monocrystalline silicon layer having a phosphorous concentration approximately in the range of 1E18-1E20 atoms/cm$^3$. In one embodiment, the first silicon layer 102 is formed as an N-type monocrystalline silicon layer having a thickness approximately in the range of 0.1-10 microns. In a specific embodiment, the first silicon layer 102 is formed using a combination of silane ($SiH_4$), nitrogen ($N_2$) and phosphine ($PH_3$) as process gases.

Figure 3:
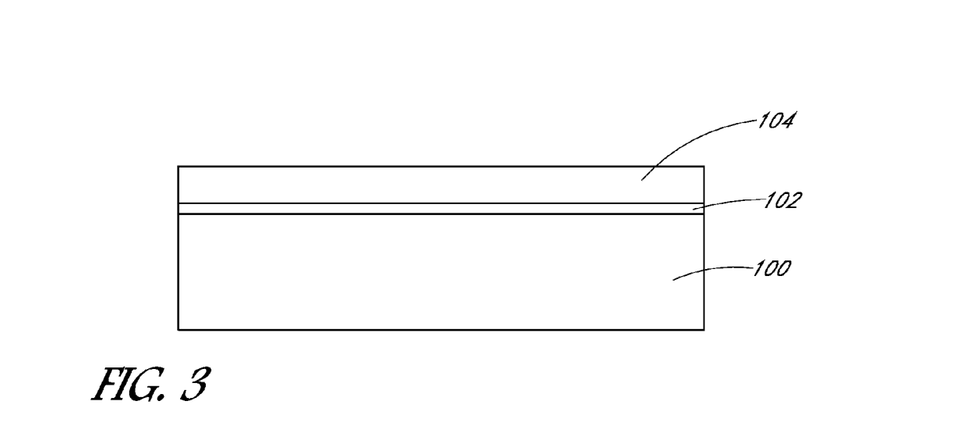
FIG. 3 illustrates the structure of FIG. 2 having a second silicon layer formed thereon.

Referring now to operation 706 of flowchart 700 and to corresponding FIG. 3, the method of fabricating a solar cell involves forming a second silicon layer 104 on the first silicon layer 102. In an embodiment, the second silicon layer 104 is of the first conductivity type.

In an embodiment, the second silicon layer 104 is formed by depositing silicon at a temperature approximately in the range of 1000-1300 degrees Celsius. In one such embodiment, the second silicon layer 104 is formed as an N-type monocrystalline silicon layer having a phosphorous concentration approximately in the range of 1E14-1E17 atoms/cm$^3$. In one embodiment, the second silicon layer 104 is formed as an N-type monocrystalline silicon layer having a thickness approximately in the range of 10-100 microns. In a specific embodiment, the second silicon layer 104 is formed using a combination of silane ($SiH_4$), nitrogen ($N_2$) and phosphine ($PH_3$) as process gases.

Figure 4:
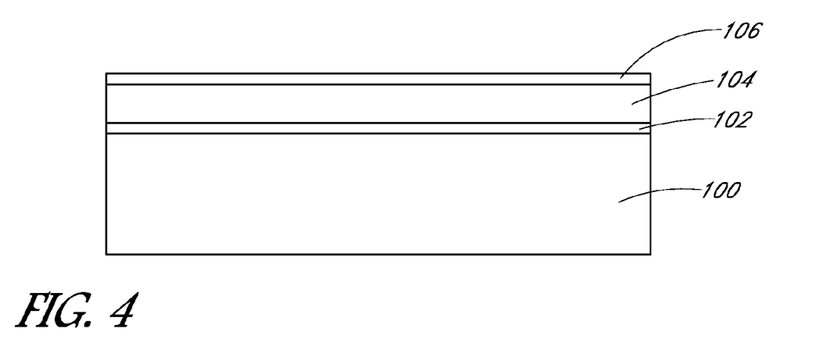
FIG. 4 illustrates the structure of FIG. 3 having a thin oxide layer formed thereon.

Referring now to operation 708 of flowchart 700 and to corresponding FIG. 4, the method of fabricating a solar cell optionally involves forming a thin oxide layer 106 on the second silicon layer 104.

In an embodiment, the thin oxide layer 106 is formed on the second silicon layer 104 by depositing the thin oxide layer or thermally growing the thin oxide layer, or a combination of thermal growth and deposition. In one embodiment, at least some of the thin oxide layer 106 is deposited using a combination of silane ($SiH_4$) and oxygen ($O_2$) as process gases.

Figure 5:
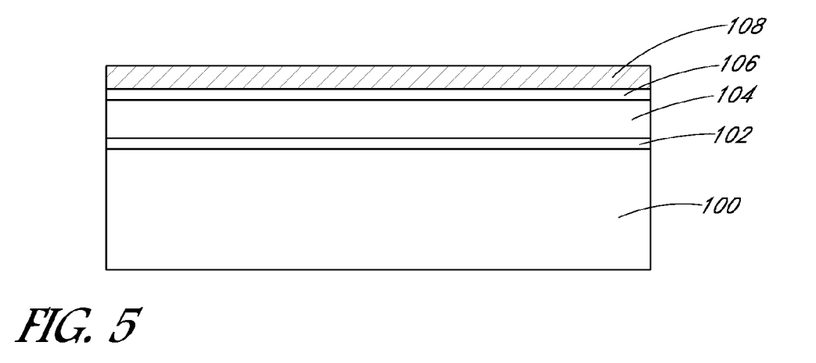
FIG. 5 illustrates the structure of FIG. 4 having a third silicon layer formed thereon.

Referring now to operation 710 of flowchart 700 and to corresponding FIG. 5, the method of fabricating a solar cell involves forming a third silicon layer 108 above the second silicon layer 104. In an embodiment, the third silicon layer 108 is of a second, different, conductivity type. In an embodiment, in the case that the thin oxide layer 106 is formed, the third silicon layer is formed on the thin oxide layer 106, as is depicted in FIG. 5.

In an embodiment, the third silicon layer 108 is formed by depositing silicon at a temperature approximately in the range of 1000-1300 degrees Celsius. In one such embodiment, the third silicon layer 108 is formed as a P-type polycrystalline or monocrystalline silicon layer having a boron concentration approximately in the range of 1E18-1E20 atoms/cm$^3$. In one embodiment, the third silicon layer 108 is formed as a P-type polycrystalline or monocrystalline silicon layer having a thickness approximately in the range of 0.1-1 microns. In a specific embodiment, the first silicon layer 102 is formed using a combination of silane ($SiH_4$), nitrogen ($N_2$) and a boron source (e.g., one or more of $BH_3$, $B_2H_6$ or $BBr_3$) as process gases.

In another embodiment, a low temperature P-type polycrystalline silicon layer is formed as the third silicon layer 108. For example, a P-type polycrystalline layer is formed on the thin oxide layer 106, such as a silicon oxide layer, at a temperature approximately in the range of 400-800 degrees Celsius.

In another embodiment, a P-type monocrystalline silicon layer is formed as the third silicon layer 108 on a thin dielectric layer (as an example of layer 108) that is suitable for permitting monocrystalline growth. In an exemplary embodiment, a P-type monocrystalline silicon layer is formed as the third silicon layer 108 on a thin gadolinium oxide layer.

Figure 6:
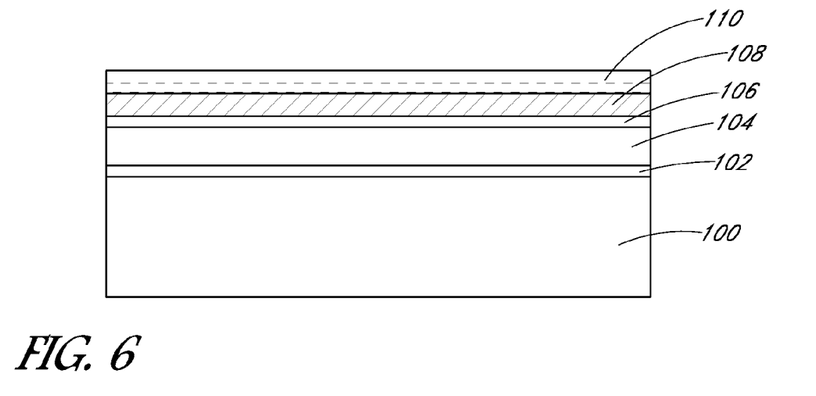
FIG. 6 illustrates the structure of FIG. 5 having a solid state doping layer formed thereon.
Figure 7:
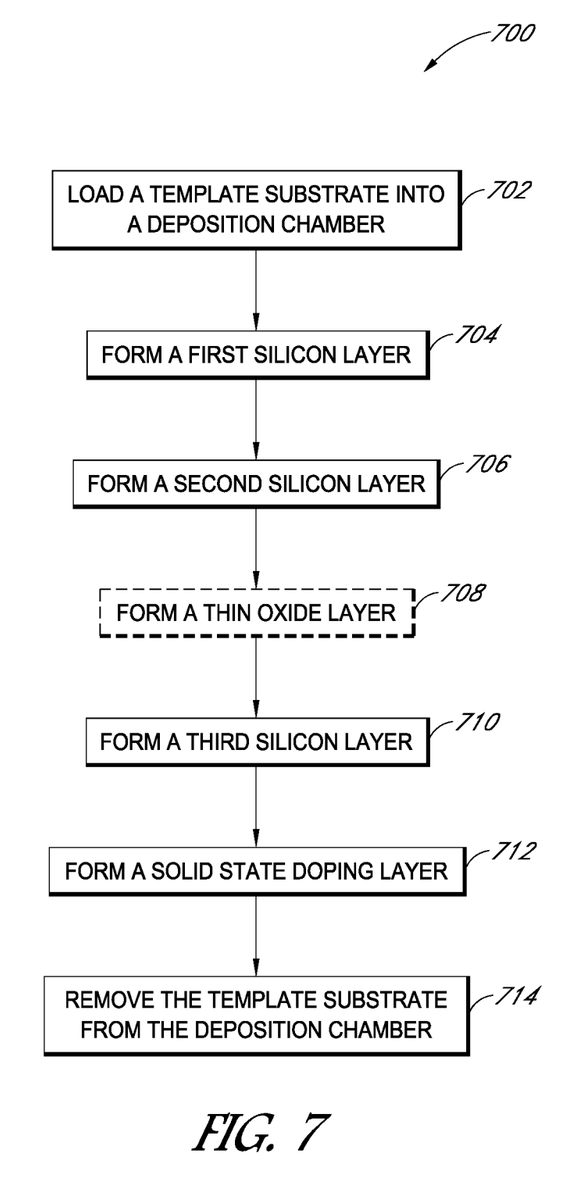
FIG. 7 is a flowchart listing operations in a method of fabricating a solar cell as corresponding to FIGS. 1-6, in accordance with an embodiment of the present disclosure.

Referring now to operation 712 of flowchart 700 and to corresponding FIG. 6, the method of fabricating a solar cell involves forming a solid state doping layer 110 on the third silicon layer 108. In an embodiment, the solid state doping layer 110 is of the first conductivity type.

In an embodiment, the solid state doping layer 110 is formed by deposition at a temperature approximately in the range of 400-1000 degrees Celsius. In one such embodiment, the template substrate 100 is initially loaded into the deposition chamber at a chamber temperature approximately in the range of 400-800 degrees Celsius. The above described silicon layers are then formed at temperatures in the range of 1000-1300 degrees Celsius. Subsequently, the temperature in the chamber is allowed to drop and the solid state doping layer 110 is formed by depositing at or near the initial chamber temperature that is approximately in the range of 400-800 degrees Celsius. In a particular embodiment, addressing manufacturing throughput, the temperature of the depositions of the solid state doping layer 110 is at or near the temperature need for introduction of a subsequent template substrate into the chamber.

In an embodiment, the solid state doping layer 110 is a phosphosilicate glass (PSG) layer. In one such embodiment, the PSG layer is formed from a combination of silane ($SiH_4$), oxygen ($O_2$) and phosphine ($PH_3$) as process gases, or from a combination of silane ($SiH_4$) and $P_2O_5$. In an embodiment, by depositing the solid state doping layer 110 at a relatively lower temperature than the other deposition temperatures, driving of dopants form the solid state doping layer 110 into the third silicon layer 108 may be inhibited until subsequent processing/patterning operations performed outside of the deposition chamber.

Referring now to operation 714 of flowchart 700, the method of fabricating a solar cell involves, subsequent to forming the solid state doping layer 110 on the third silicon layer 108, removing the template substrate 100 from the deposition chamber.

In an embodiment, the template substrate 100 is removed from the deposition chamber immediately following (e.g., without further deposition processes) forming the solid state doping layer 110. As mentioned above, in one embodiment, this approach allows for introduction of new substrate without a substantial temperature change required following deposition of solid state doping layer 110.

Figure 8:
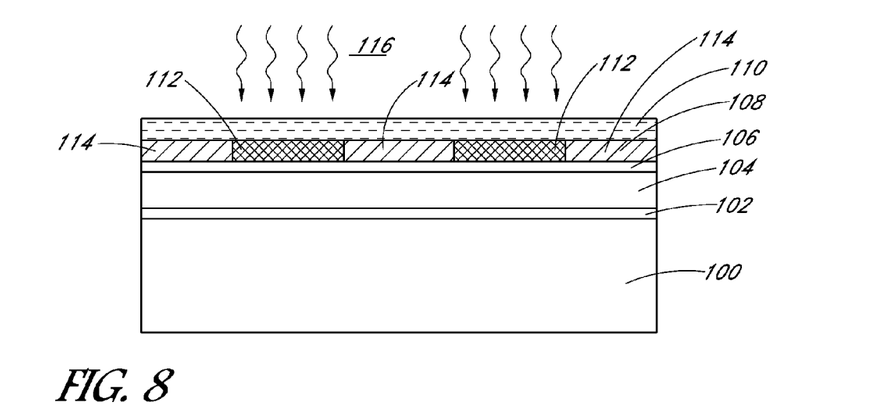
FIG. 8 illustrates the structure of FIG. 6 following the driving of dopants from the solid state doping layer into regions of the third silicon layer.
Figure 9:
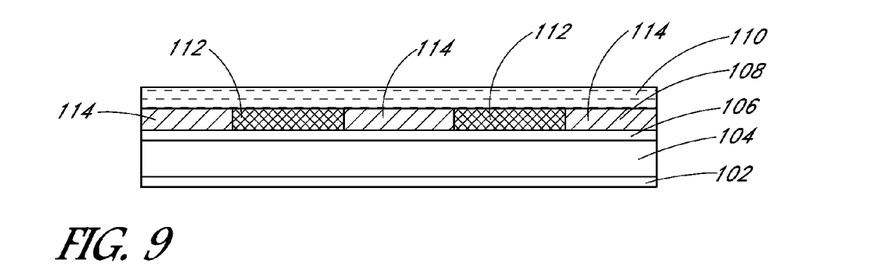
FIG. 9 illustrates the structure of FIG. 8 following removal, as a single material stack for a solar cell, the first silicon layer, the second silicon layer, and the third silicon layer from the template substrate.
Figure 10:
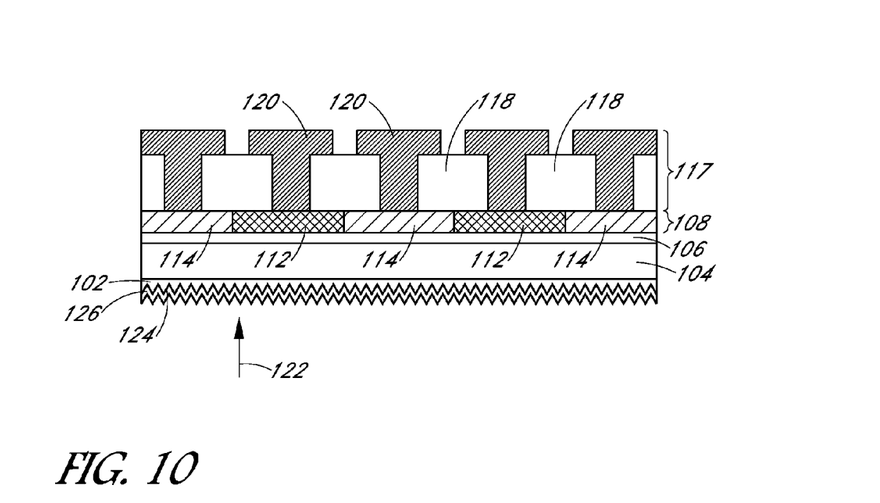
FIG. 10 illustrates the structure of FIG. 9 following formation of a metallization structure.
Figure 11:
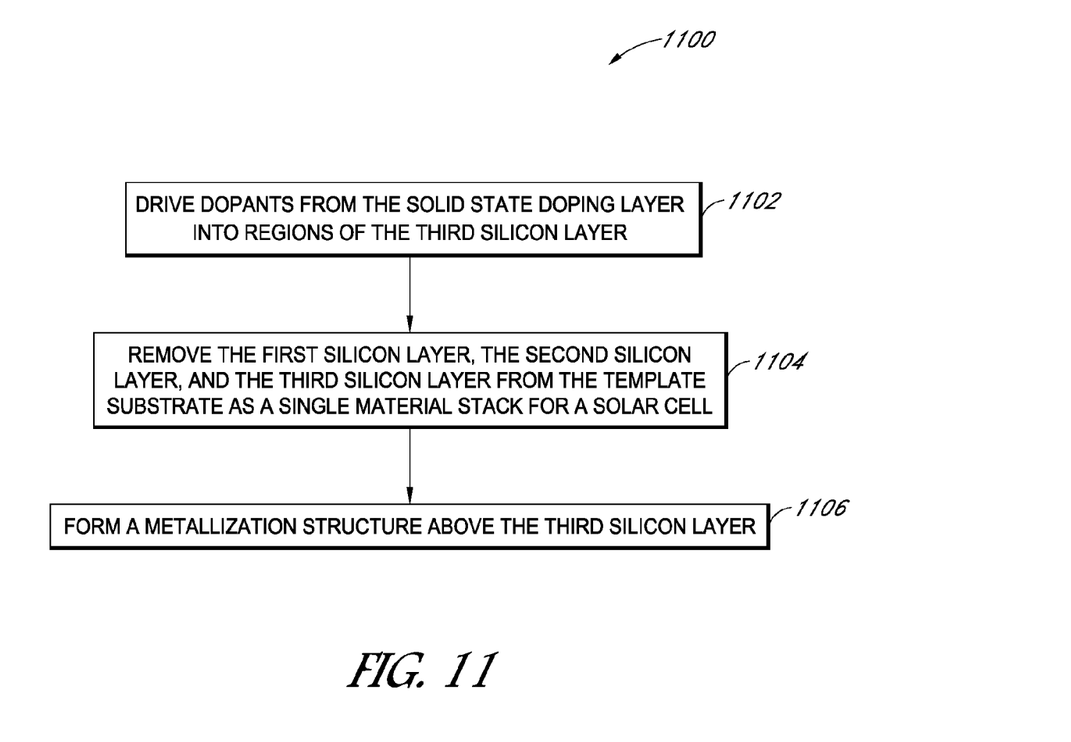
FIG. 11 is a flowchart listing operations in a method of fabricating a solar cell as corresponding to FIGS. 8-10, in accordance with an embodiment of the present disclosure.

Once the template substrate having the above described layers is removed from the deposition chamber, further processing may be performed. In an exemplary furthering process flow, FIGS. 8-10 illustrate cross-sectional views of various stages in the fabrication of a solar cell, in accordance with an embodiment of the present disclosure. FIG. 11 is a flowchart 1100 listing operations in a method of fabricating a solar cell, as corresponding to FIGS. 8-10, in accordance with an embodiment of the present disclosure.

Referring to operation 1102 of flowchart 1100 and to corresponding FIG. 8, a method of fabricating a solar cell involves, subsequent to removing the template substrate 100 from the deposition chamber, driving dopants from the solid state doping layer 110 into regions 112 of the third silicon layer 108, leaving remaining regions 114 of the third silicon layer 108.

In an embodiment, the dopants are driven in a pattern suitable for P-type and N-type finger contact patterning. That is, the dopants are driven only in locations where an N-type emitter region is needed (e.g., in the case that phosphorous dopants are driven from a PSG layer). In one embodiment, the driving is performed using direct write laser irradiation 116 of portions of the PSG layer, as is depicted in FIG. 8. In other embodiment, a mask and etch process is performed on the PSG layer. In either case, a subsequent anneal may be performed either in the presence of or following removal of the PSG layer.

In accordance with an embodiment of the present disclosure, regardless of how performed, the driving of the dopants converts the regions 112 to N-type regions. In order to covert the regions, e.g., from P-type to N-type, the subsequently incorporated N-type dopants may have to overwhelm the present P-type dopants by at least one order of magnitude with respect to total dopant concentration in the regions 112. In an embodiment, the electrical conversion of regions 112 leads to formation of a P/N junction between adjacent regions 112 and 114 within layer 108. In a particular embodiment, the regions 112 are implanted to provide phosphorous-implanted regions of the boron-containing silicon layer 108 where the concentration of the phosphorous impurity of the phosphorous-implanted regions 112 is at least 10-fold (i.e., at least one order of magnitude) greater than the concentration of boron impurity in the regions 108 and, hence, at least one order of magnitude greater than the concentration of boron impurity in the non-phosphorous-implanted regions 114. In one embodiment, the counter-doped regions are at least an order of magnitude greater in doping concentration in order to sufficiently overwhelm (counter-dope) the first included dopant to dominate the doping characteristic. However, in that embodiment, the counter-doped regions are no more than approximately two or three orders of magnitude greater in doping concentrations such that conductivity differences of counter-doped versus non-counter-doped regions does not impact ultimate performance and efficiency of the solar cell. It is to be appreciated that some residual doping of the P-type regions 114 may actually occur, e.g., through scatter or imperfect doping. However, any such residual doping is not sufficient to counter-dope the ultimately remaining P-type regions 114.

Referring to operation 1104 of flowchart 1100 and to corresponding FIG. 9, the method of fabricating a solar cell involves removing, as a single material stack for a solar cell, the first silicon layer 102, the second silicon layer 104, the thin oxide layer (if present), and the third silicon layer 108 from the template substrate 100.

Thus, in an embodiment, a first N-type monocrystalline silicon layer, a second N-type monocrystalline silicon layer, and a P-type monocrystalline silicon layer are removed as a single material stack for a solar cell from a porous silicon substrate. In an embodiment, the solid state doping layer 110 is retained during removal, as is depicted in FIG. 9. However, in other embodiments, the solid state doping layer 110 is removed prior to removal of the material stack from the template substrate 100.

Referring to operation 1106 of flowchart 1100 and to corresponding FIG. 10, the method of fabricating a solar cell involves forming a metallization structure 117 above the third silicon layer 108. Although depicted in an exemplary order, it is to be appreciated that operations 1102, 1104 and 1106 may be performed in alternate orders, depending on the most efficient manufacturing process which may be defined by a particular set-up in a manufacturing facility. It is also to be appreciated that the solid state doping layer may be removed altogether following dopant driving, or may retained intact or in part as an artifact in a final solar cell architecture.

Referring to FIG. 10, in an embodiment, the metallization structure is formed by patterning an insulating layer 118 and forming conductive contacts 120 therein. The conductive contacts 120 are electrically connected to regions 112 and 114 of the third silicon layer 108, i.e., to the crystalline silicon emitter regions of the solar cell. In an embodiment, the conductive contact structures 120 are fabricated by first depositing and patterning the insulating layer 118 to have openings and then forming one or more conductive layers in the openings. In one such embodiment, the openings are formed by laser ablation. In an embodiment, the conductive contact structures 120 include metal and are formed by a deposition, lithographic, and etch approach or, alternatively, a printing or plating process or, alternatively, a foil adhesion process.

Referring again to FIG. 10, removing the single material stack for the solar cell involves providing the first N-type monocrystalline silicon layer 102 as a light-receiving surface 122 of the solar cell. In one such embodiment, the light-receiving surface 122 of the solar cell is texturized to provide a texturized surface 124 of an ultimately fabricated solar cell. In one such embodiment, a hydroxide-based wet etchant is employed to texturize the N-type monocrystalline silicon layer 102. It is to be appreciated that the timing of the texturizing of the light receiving surface may vary. In an embodiment, a texturized surface may be one which has a regular or an irregular shaped surface for scattering incoming light, decreasing the amount of light reflected off of the light-receiving surfaces of the solar cell.

Referring again to FIG. 10, additional embodiments can include formation of a passivation and/or anti-reflective coating (ARC) layers (shown collectively as layer 126) on the light-receiving surface 122, such as silicon nitride, silicon, silicon oxide or silicon oxynitride layers. It is to be appreciated that the timing of the formation of passivation and/or ARC layers may also vary.

One or more embodiments described herein are directed to solar cells having emitter regions form above a substrate of the solar cell and, particularly, to such solar cells having a trench-free arrangement of the emitter regions. For reference, state-of-the-art solar cells having emitter regions formed in a polycrystalline silicon layer on a back surface of a back contact solar cell often have gaps separating N-type and P-type emitter regions. Furthermore, the gap is often extended to form a trench that extends into the underlying substrate. As such, such solar cells can be referred to as trench-contact solar cells. By contrast, one or more embodiments described herein are directed to solar cell process flows that provide trench-free arrangements in a simplified deposition approach. In one embodiment, the trench-free arrangement is provided in a polycrystalline silicon layer. In another embodiment, the trench-free arrangement is provided in a monocrystalline silicon layer, an exemplar solar cell for which is described below.

With reference again to FIG. 10, in an embodiment, a solar cell includes a substrate (layer 102 plus layer 104) having a light-receiving surface (exposed surface of layer 102) and a back surface. A thin dielectric layer 106 is disposed on the back surface of the substrate. A first monocrystalline silicon emitter region 112 is disposed on a first portion of the thin dielectric layer 106 and is doped with an impurity of a first conductivity type, e.g., an N-type impurity. A second monocrystalline silicon emitter region 114 is disposed on a second portion of the thin dielectric layer 106 proximate to the first monocrystalline silicon emitter region 112 disposed on the first portion of the thin dielectric layer 106. The second monocrystalline silicon emitter region 114 is doped with an impurity of a second, opposite, conductivity type, e.g., a P-type impurity. In an embodiment, there is a P/N junction between the first monocrystalline silicon emitter region 112 and the second monocrystalline silicon emitter region 114.

In one such embodiment, the first monocrystalline silicon emitter region 112 further includes the impurity of the second conductivity type, e.g., the region 112 includes both N-type and P-type impurities. In a specific such embodiment, the total concentration of the impurity of the first conductivity type in the first monocrystalline silicon emitter region 112 is greater than approximately one order of magnitude than the total concentration of the impurity of the second conductivity type in the second monocrystalline silicon emitter region 114 and in the first monocrystalline silicon emitter region 112. In an embodiment, the solar cell further includes a first conductive contact structure 120 electrically connected to the first monocrystalline silicon emitter region 112, and a second conductive contact structure 120 electrically connected to the second monocrystalline silicon emitter region 114.

Overall, although certain materials are described specifically above, some materials may be readily substituted with others with other such embodiments remaining within the spirit and scope of embodiments of the present disclosure. For example, in an embodiment, a different material layer may be formed to ultimately provide a solar cell substrate. In one such embodiment, a group III-V material layer is formed to ultimately provide a solar cell substrate, instead of forming an N-type silicon layer for ultimate use as a solar cell substrate.

Furthermore, it is to be appreciated that, where N+ and P+ type doping is described specifically, other embodiments contemplated include the opposite conductivity type, e.g., P+ and N+ type doping, respectively. Additionally, although reference is made significantly to back contact solar cell arrangements, it is to be appreciated that approaches described herein may have application to front contact solar cells as well. In other embodiments, the so-called trench-free process described above may be implemented to ultimately fabricate trench-contact solar cells. For example, a process flow such as described above may first be implemented, and trenches may subsequently be formed between the emitter regions.

Thus, methods of fabricating solar cells using simplified deposition processes, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a monocrystalline silicon semiconductor substrate having a light-receiving surface and a back surface;
   a dielectric layer disposed directly on the back surface of the substrate;
   a monocrystalline silicon layer disposed directly on the dielectric layer, wherein the dielectric layer is between the substrate and the monocrystalline silicon layer;
   wherein the monocrystalline silicon layer comprises a first monocrystalline silicon emitter region doped with an impurity of a first conductivity type and a second monocrystalline silicon emitter region doped with an impurity of a second, opposite conductivity type, wherein the first monocrystalline silicon emitter region and the second monocrystalline silicon emitter region are in direct contact with the dielectric layer; and
   wherein the first monocrystalline silicon emitter region is in direct contact with the second monocrystalline silicon emitter region forming a P/N junction between the first monocrystalline silicon emitter region and the second monocrystalline silicon emitter region.

2. The solar cell of claim 1, wherein the first monocrystalline silicon emitter region further comprises the impurity of the second conductivity type.

3. The solar cell of claim 2, wherein the total concentration of the impurity of the first conductivity type in the first monocrystalline silicon emitter region is greater than the total concentration of the impurity of the second conductivity type in the first and second monocrystalline silicon emitter regions by at least one order of magnitude.

4. The solar cell of claim 1, further comprising:
   a first conductive contact structure electrically connected to the first monocrystalline silicon emitter region; and
   a second conductive contact structure electrically connected to the second monocrystalline silicon emitter region.

5. The solar cell of claim 1, wherein the dielectric layer comprises gadolinium oxide.

* * * * *